US012681802B2

(12) United States Patent
Mahanty et al.

(10) Patent No.: US 12,681,802 B2
(45) Date of Patent: Jul. 14, 2026

(54) REDUNDANT DATA STORAGE USING INCREMENTAL ERROR DETECTION WITH NON-ZERO SEEDS

(71) Applicant: Xilinx, Inc., San Jose, CA (US)

(72) Inventors: Arindam Mahanty, Hyderabad (IN); Kaustuvmani Manji, Hyderabad (IN); Sebastian Turullols, Los Altos, CA (US); Nagamurali Narasimha Rao Medeme, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 1 day.

(21) Appl. No.: 18/749,944

(22) Filed: Jun. 21, 2024

(65) Prior Publication Data

US 2025/0390380 A1      Dec. 25, 2025

(51) Int. Cl.
*G06F 11/10* (2006.01)
*G06F 3/06* (2006.01)
*G06F 11/20* (2006.01)
*H03M 13/09* (2006.01)

(52) U.S. Cl.
CPC ........ *G06F 11/1044* (2013.01); *G06F 3/0619* (2013.01); *G06F 11/1004* (2013.01); *G06F 11/2056* (2013.01); *H03M 13/09* (2013.01)

(58) Field of Classification Search
CPC ............. G06F 11/1004; G06F 11/2056; G06F 3/0619; G06F 3/0601; G06F 11/1044; H03M 13/09; H03M 13/091
See application file for complete search history.

(56) References Cited

U.S. PATENT DOCUMENTS

| | | | | |
|---|---|---|---|---|
| 6,434,720 B1* | 8/2002 | Meyer | ................. | G06F 11/1612 |
| | | | | 714/E11.062 |
| 7,073,024 B1* | 7/2006 | Chilton | ............... | G06F 11/1076 |
| | | | | 714/E11.034 |
| 10,067,821 B2* | 9/2018 | Kim | ...................... | H04L 69/324 |
| 2004/0158793 A1* | 8/2004 | Blightman | ............ | H04L 69/163 |
| | | | | 714/758 |
| 2013/0007573 A1* | 1/2013 | Radhakrishnan | ... | H03M 13/158 |
| | | | | 714/E11.032 |
| 2015/0254088 A1* | 9/2015 | Chou | ................... | H04L 67/1097 |
| | | | | 718/1 |
| 2021/0141685 A1* | 5/2021 | Li | ........................ | G06F 11/0793 |

OTHER PUBLICATIONS

Wikipedia's Cyclic Redundancy Check Historical version published May 4, 2024 https://en.wikipedia.org/w/index.php?title=Cyclic_redundancy_check&oldid=1222181530 (Year: 2024).*

(Continued)

*Primary Examiner* — Joseph O Schell
(74) *Attorney, Agent, or Firm* — Kevin T. Cuenot

(57) ABSTRACT

Redundant data storage includes performing a first data transfer to a first storage device as part of a redundant write operation. A first error detection code is generated for the first data transfer. A second data transfer is performed to a second storage device as part of the redundant write operation. A second error detection code is generated for the second data transfer. The first error detection code is compared with the second error detection code for a match indicating that data of the first data transfer matches data of the second data transfer.

18 Claims, 8 Drawing Sheets

(56)        References Cited

OTHER PUBLICATIONS

Stavinov, E., A practical parallel CRC generation method., Circuit Cellar-The Magazine For Computer Applications 31, Issue No. 234, Jan. 2010, pp. 38-45.
Santran, J. et al., "Out of order incremental CRC computation," IEEE Transactions on Computers, vol. 54, No. 9, 2005, pp. 1178-1181, [IBM Haifa Labs, Feb. 25, 2023, 11 pg.].

* cited by examiner

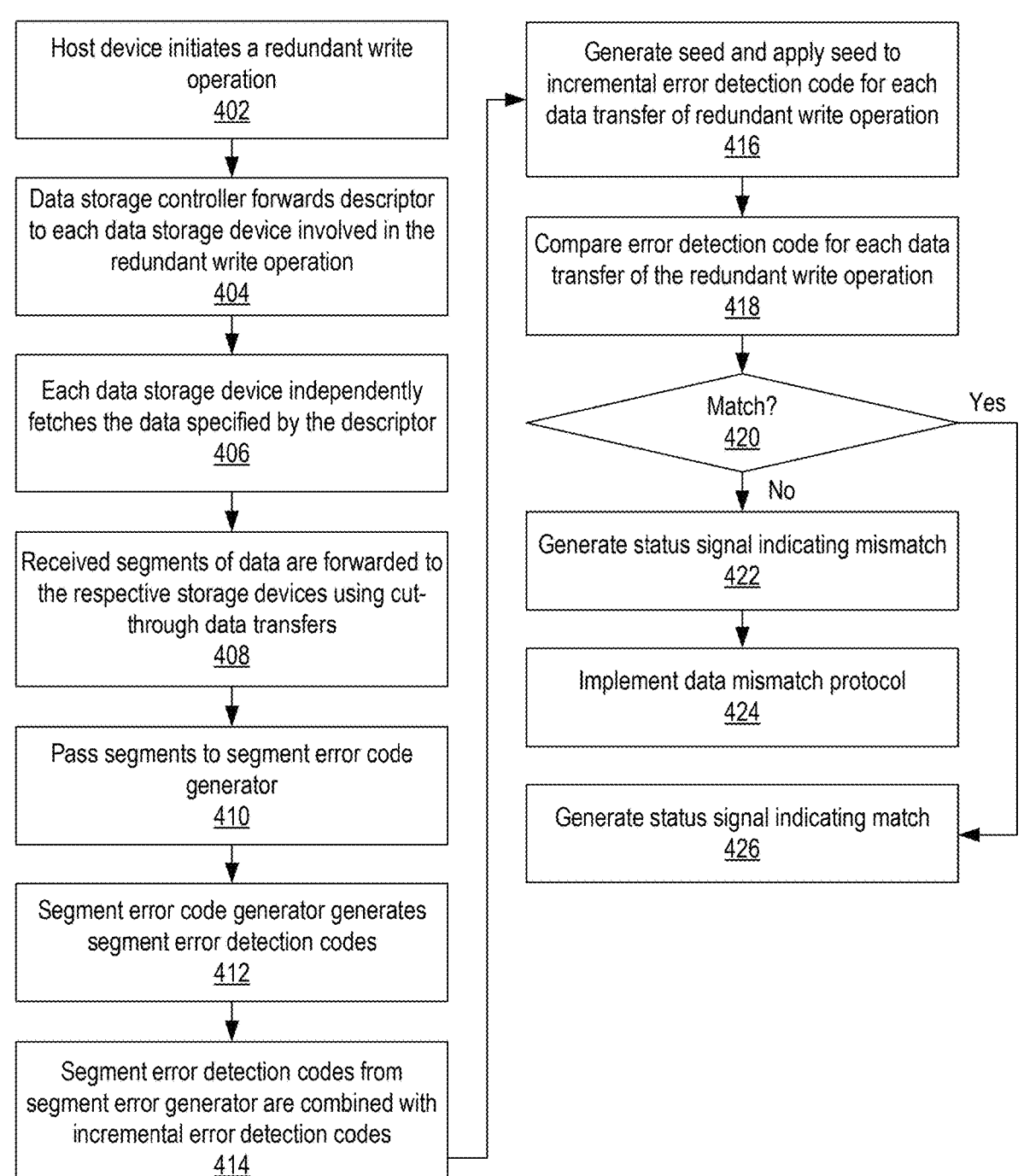

400

Host device initiates a redundant write operation
402

Data storage controller forwards descriptor to each data storage device involved in the redundant write operation
404

Each data storage device independently fetches the data specified by the descriptor
406

Received segments of data are forwarded to the respective storage devices using cut-through data transfers
408

Pass segments to segment error code generator
410

Segment error code generator generates segment error detection codes
412

Segment error detection codes from segment error generator are combined with incremental error detection codes
414

Generate seed and apply seed to incremental error detection code for each data transfer of redundant write operation
416

Compare error detection code for each data transfer of the redundant write operation
418

Match?
420

Yes

No

Generate status signal indicating mismatch
422

Implement data mismatch protocol
424

Generate status signal indicating match
426

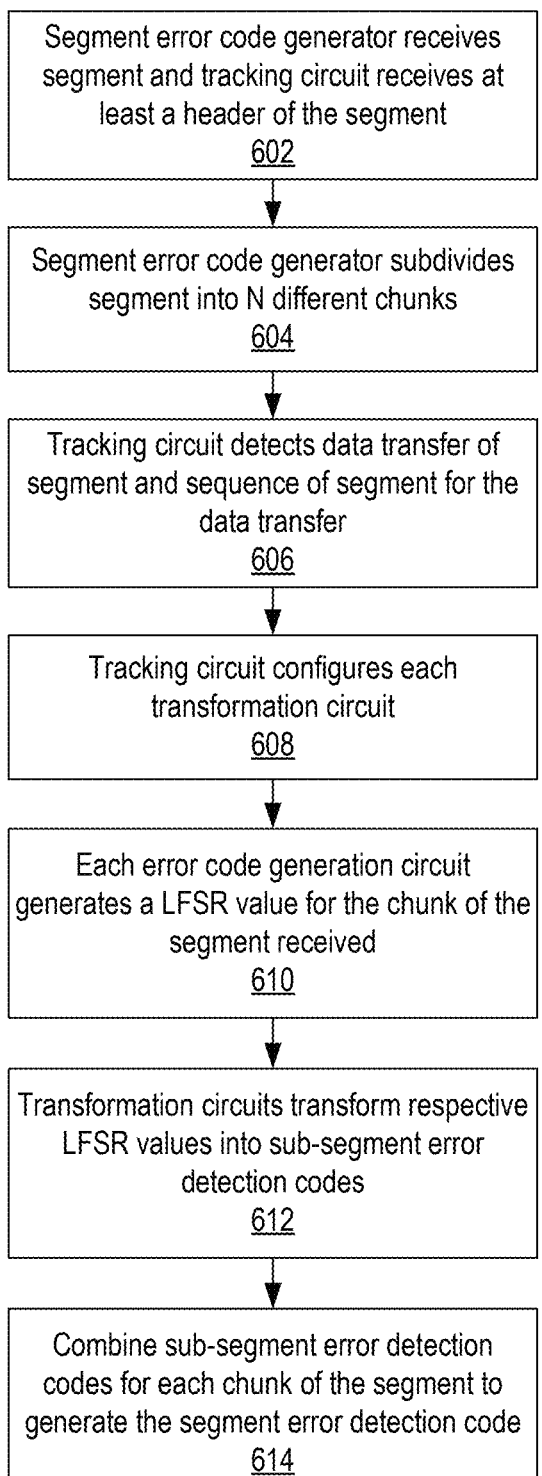

Segment error code generator receives
segment and tracking circuit receives at
least a header of the segment
602

Segment error code generator subdivides
segment into N different chunks
604

Tracking circuit detects data transfer of
segment and sequence of segment for the
data transfer
606

Tracking circuit configures each
transformation circuit
608

Each error code generation circuit
generates a LFSR value for the chunk of the
segment received
610

Transformation circuits transform respective
LFSR values into sub-segment error
detection codes
612

Combine sub-segment error detection
codes for each chunk of the segment to
generate the segment error detection code
614

FIG. 6

REDUNDANT DATA STORAGE USING INCREMENTAL ERROR DETECTION WITH NON-ZERO SEEDS

TECHNICAL FIELD

This disclosure relates to data storage systems that employ redundancy.

BACKGROUND

A data storage system that employs redundancy typically includes a plurality of storage devices. Data is stored on the storage devices such that failure of one, and sometimes more, of the storage devices does not result in data loss. Rather, the data on the failing storage device may be read from a functional storage device of the data storage system or rebuilt from one or more functional storage devices of the data storage system.

Redundant Array of Independent Disks (RAID) is a technology that harnesses different data storage techniques to manage input/output (I/O) operations of a computer system across multiple storage devices. Different RAID configurations employ different data storage techniques to achieve different ends. RAID 0, for example, utilizes data striping across two storage devices to provide improved speed. RAID 0, however, does not provide redundancy in that data may not be recovered if one or both of the storage devices fail. RAID 1 uses data mirroring to store identical data on each of two different storage devices. RAID 1 does provide redundancy in that if one storage device fails, the data may be read from the other storage device.

SUMMARY

In one or more embodiments, a method of redundant data storage includes performing a first data transfer to a first storage device as part of a redundant write operation. The method includes generating a first error detection code for the first data transfer. The method includes performing a second data transfer to a second storage device as part of the redundant write operation. The method includes generating a second error detection code for the second data transfer. The method includes comparing the first error detection code with the second error detection code for a match indicating that data of the first data transfer matches data of the second data transfer.

In one or more embodiments, a device includes a memory configured to store incremental error detection codes for a first data transfer and a second data transfer of a redundant write operation. The device includes a segment error code generator configured to generate segment error detection codes on a per segment basis for segments of the first data transfer and the second data transfer. The device includes a tracking circuit configured to provide parameters to the segment error code generator on a per segment basis based, at least in part, on an order of the segments as received for the first data transfer and the second data transfer. The device includes an adder circuit configured to generate a first incremental error detection code by combining the segment error detection codes of the first data transfer and generate a second incremental error detection code by combining the segment error detection codes of the second data transfer. The device includes a seed circuit configured to generate a first error detection code for the first data transfer by applying a seed to the first incremental error detection code and generate a second error detection code by applying the seed to the second incremental error detection code. The device includes a comparison circuit configured to compare the first error detection code with the second error detection code.

In one or more embodiments, a method includes, for each of a plurality of data transfers of a redundant storage operation, receiving a plurality of segments of data. For each of the plurality of data transfers of the redundant storage operation, subdividing each segment into a plurality of chunks. For each of the plurality of data transfers of the redundant storage operation, generating, in parallel, a plurality of sub-segment error detection codes corresponding to the plurality of chunks. For each of the plurality of data transfers of the redundant storage operation and for each segment, generating a segment error detection code by combining the plurality of sub-segment error detection codes for the segment. For each of the plurality of data transfers of the redundant storage operation, generating an error detection code for each data transfer of the plurality of data transfers by combining each segment error detection code of the data transfer and applying a seed thereto.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 4 illustrates another method of implementing a redundant write operation in accordance with one or more embodiments of the disclosed technology.

FIG. 6 illustrates a method of generating segment error detection codes in accordance with one or more embodiments of the disclosed technology.

DETAILED DESCRIPTION

Figure 1:
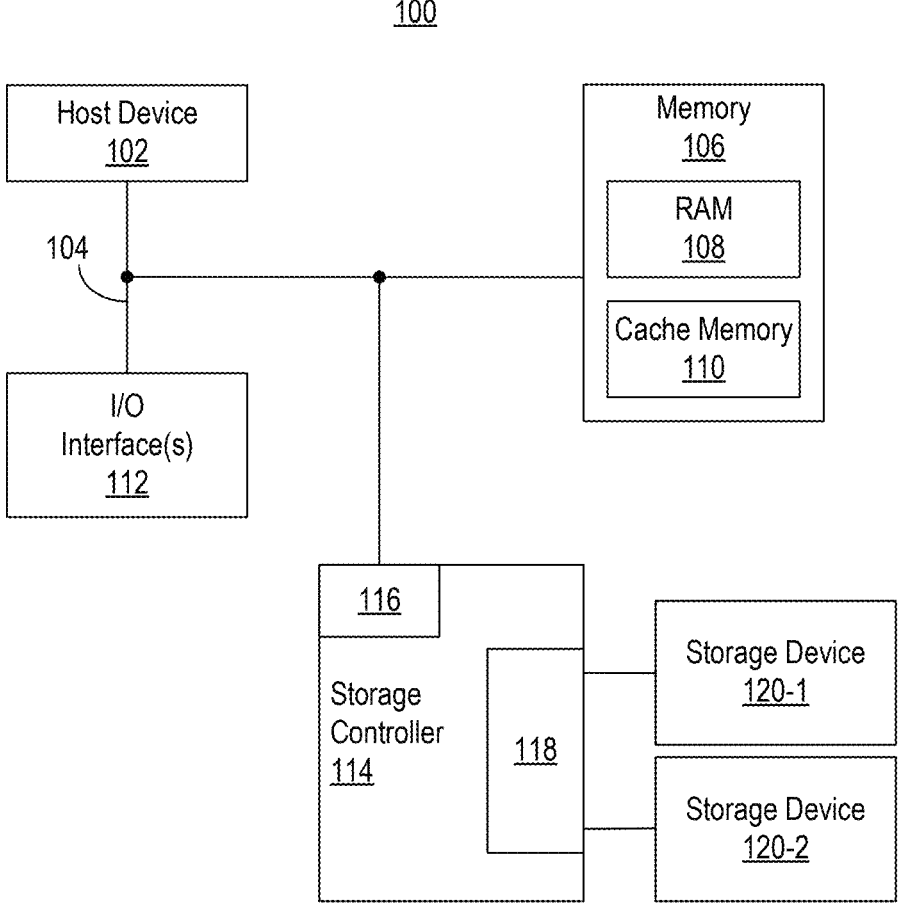
FIG. 1 illustrates a data processing system configured to implement redundant write operations in accordance with one or more embodiments of the disclosed technology.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to redundant data storage systems. Within conventional data storage systems that utilize redundancy, store-and-forward data transfers are often used. For purposes of illustration, consider a data storage system that utilizes RAID 1 (e.g., mirroring) to provide redundancy. In a data storage system configured to operate using RAID 1, an intermediary device (intermediary) such as a RAID controller will include sufficient onboard memory to implement store-and-forward data transfers.

In a typical store-and-forward scenario, the intermediary receives the data to be written to the storage devices from a host device. The host device may send the data in smaller portions referred to herein as segments. The segments may travel to the intermediary independently and, as such, arrive in any order. The intermediary assembles the segments to form the complete set of data (e.g., the message) in the internal buffer. From that complete message, the intermediary may calculate an error detection code that may be compared against an error detection code included with the data to verify that the data was received intact or error free.

Subsequent to buffering the entirety of the data of the redundant write operation, the intermediary writes the data to the first storage device and then writes the data to the second storage device to achieve redundancy. In performing the write to each storage device, the intermediary uses the internal buffer as the data source rather than re-reading the data from the host device. Store-and-forward is used to guarantee that the redundant write operation performed by the intermediary stores the same data in the first storage device and the second storage device to achieve the desired redundancy.

Store-and-forward, however, suffers from several disadvantages. For example, store-and-forward suffers from increased latency since the intermediary must receive the entirety of the data of a write operation, assemble the segments of the data, and store such data in the internal buffer before any write to either of the storage devices may begin. Further, the entirety of the data must be received and stored in order. As the data may be received out of order, the recipient is tasked with ordering the data prior to storage. From the complete set of data, an error detection code may be generated and used for comparison to ensure data integrity. Additionally, since the intermediary is typically capable of handling many in-progress (e.g., in-flight) redundant write operations, the amount of internal memory that is needed to support store-and-forward operation is not based on implementing one such redundant write operation, but on implementing many redundant write operations concurrently or in an overlapping manner. This further increases the size of the onboard memory needed and increases the power consumption, size, and complexity of the intermediary.

In accordance with the inventive arrangements described within this disclosure, devices, systems, and methods are disclosed that provide cut-through forwarding of data for data storage systems that employ redundancy. Cut-through forwarding refers to a data transfer technique in which a device, e.g., the intermediary, begins receiving data from the host device and can begin forwarding that data to a target device before the entirety of the data has been received in the intermediary. Use of cut-through data transfers or forwarding can significantly reduce the amount of memory needed to implement the intermediary.

In one or more embodiments, cut-through forwarding is implemented for a redundant data storage system by fetching the data to be written from the host device multiple times. For example, the intermediary fetches data from the host device a first time to write the data to a first storage device. Because the entirety of the data is not buffered within the intermediary, the intermediary fetches the data from the host device a second time to write the data to a second storage device. Further, because segments may be received out of order, the inventive arrangements utilize incremental error detection code generation to generate an error detection code for the data as received to perform a comparison to ensure or guarantee data integrity and that the data written to each storage device for the redundant write operation matches or is identical.

By employing cut-through forwarding, incremental error detection code generation, and data checking as described within this disclosure, the need for a large internal buffer in the intermediary is reduced or eliminated. This reduces the size, power consumption, and complexity of the intermediary. Further, latency is reduced by using cut-through forwarding to perform the data transfers since the internal buffering process and data reassembly performed by conventional controllers that use store-and-forward is no longer required.

Further aspects of the inventive arrangements are described below with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates a data processing system 100 configured to perform redundant write operations in accordance with one or more embodiments of the disclosed technology. As defined herein, the term "data processing system" means one or more hardware systems configured to process data, where each hardware system includes one or more processors and memory. The processor(s) are programmed with computer-readable instructions that, upon execution, initiate operations.

In the example of FIG. 1, data processing system 100 can include a host device 102, a bus 104, a memory 106, one or more input/output (I/O) interfaces 112, a storage controller 114, and a plurality of storage devices 120. In the example, bus 104 couples host device 102, memory 106, I/O interfaces 112, and storage controller 114. Storage controller 114 is coupled to storage device 120-1 (e.g., a "first storage device") and to storage device 120-2 (e.g., a second storage device").

Host device 102 may be implemented as one or more processors. In an example, host device 102 is implemented as a central processing unit (CPU). Host device 102 is an example of a hardware processor that is implemented as one or more circuits capable of carrying out instructions and/or operations embodied as computer-readable instructions. The circuit may be an integrated circuit or embedded in an integrated circuit. Host device 102 may be implemented using a complex instruction set computer architecture (CISC), a reduced instruction set computer architecture (RISC), a vector processing architecture, or other known architectures. Example processors include, but are not limited to, processors having an x86 type of architecture (IA-32, IA-64, etc.), Power Architecture, ARM processors, and the like.

Bus 104 represents one or more of any of a variety of communication bus structures. By way of example, and not limitation, bus 104 may be implemented as a Peripheral Component Interconnect Express (PCIe) bus. It should be appreciated that other interconnect technologies may be used to implement bus 104.

Data processing system 100 typically includes a variety of computer system readable media. Such media may include computer-readable volatile and non-volatile mediums and computer-readable removable and non-removable mediums. In the example, memory 106 can include computer-readable mediums in the form of volatile memory, such as random-access memory (RAM) 108 and/or cache memory 110. Memory 106 is capable of storing computer-readable instructions that are executable by host device 102. For example, the computer-readable instructions can include one or more operating systems, a hypervisor (e.g., such as a level 1 or level 2 hypervisor), one or more application programs, other program code, and program data.

I/O interface(s) 112 are configured to allow data processing system 100 to communicate with one or more external devices and/or communicate over one or more networks such as a local area network (LAN), a wide area network (WAN), and/or a public network (e.g., the Internet). Examples of I/O interfaces 112 may include, but are not limited to, network cards, modems, network adapters, hardware controllers, etc. Examples of external devices also may include devices that allow a user to interact with data processing system 100 (e.g., a display, a keyboard, and/or a pointing device) and/or other devices such as accelerator card.

Storage controller 114 may be implemented as a device that operates as an intermediary between host device 102 and storage devices 120. In one or more embodiments, storage controller 114 is implemented as another I/O interface. In the example, storage controller 114 is capable of providing virtualization functions to host device 102 by connecting host device 102 to a plurality of storage devices 120 at the same time, e.g., concurrently. Storage controller 114 is capable of performing certain operations as described. Storage controller 114 also may operate in some contexts as a pass through enabling the exchange of data between host device 102 and storage devices 120.

Storage controller 114 is configured to perform redundant write operations to storage devices 120. In one or more embodiments, storage controller 114 implements RAID functionality such as RAID 1 functionality. As such, storage controller 114 may be configured to write data to non-volatile storage devices using mirroring. For example, storage controller 114 may be implemented as, or included in, a RAID controller.

In the example, storage controller 114 includes a host device interface 116 and a storage device interface 118. Host device interface 116 is capable of communicating with host device 102 and memory 106 over bus 104. In one or more embodiments, host device interface 116 includes one or more Physical Interfaces (PHYs) where each PHY is capable of connecting to a different host device. In this regard, data processing system 100 may include more than one host device coupled to storage controller 114. The PHYs may be coupled to one or more PCIe End Ports (EP) through interconnect circuitry. The one or more PCIe EPs are coupled to a multi-port DMA through additional interconnect circuitry. The multi-port DMA provides connectivity between host device interface 116 and other internal components and/or systems of storage controller 114.

Storage device interface 118 is capable of accessing (e.g., reading and/or writing) storage devices 120. In the example, each of storage devices 120 may operate under control of storage controller 114 to provide redundant data storage. In one or more embodiments, storage device interface 118 may include a plurality of PHYs, where each PHY connects to a different storage device. Each PHY may be coupled to a PCIe Root Port (RP).

Storage controller 114 may include additional components and/or systems as described herein in greater detail below. In one or more embodiments, storage controller 114 includes one or more Non-Volatile Memory Express (NVMe) Host Accelerators (NVMeHAs). An NVMeHA is an Intellectual Property (IP) or core that provides an interface to an NVMe drive and offloads functions such as I/O queue management from other devices. The NVMeHA is capable of providing a path for either software or hardware module(s) to interface with standard memory mapped and/or streaming interfaces. Each NVMeHA may couple to a corresponding PCIe-RP in storage device interface 118. Further, each NVMeHA may couple to an interconnect that provides connectivity to one or more other components and/or systems of storage controller 114.

In the example of FIG. 1, each of storage devices 120 may be implemented as a non-volatile storage device. Examples of non-volatile storage devices may include, but are not limited to, solid-state drives (SSDs). Examples of solid-state drives include NVMe drives. The examples provided herein are not intended to be limiting of the particular storage devices used as other non-volatile storage devices that may be read and written also may be used. Further, it should be appreciated that the incremental error detection code generation techniques described herein may be used in any of a variety of applications and/or contexts that involve receipt of out of order data whether or not such applications and/or contexts involve RAID and/or redundant storage.

In operation, host device 102 may initiate a data transfer to storage devices 120 for a particular application and/or for a particular virtual machine executing in data processing system 100. As an example, host device 102 may submit a descriptor specifying a write operation to be performed. In the case of RAID 1, host device 102 may have already indicated to storage controller 114 the particular application or particular virtual machine (e.g., the source or entity that initiates the write request) that uses redundant write operations such as RAID 1. Host device 102 may execute multiple virtual machines. Some virtual machines may support RAID 1 while others do not. Accordingly, whether storage controller 114 implements a redundant storage operation may depend on the particular source (e.g., virtual machine) that requests the write operation. Further, it should be appreciated that storage controller 114 may be coupled to more than two storage devices such that not all write operations would necessarily be redundant write operations.

In one or more embodiments, the descriptor is formatted as an NVMe Submission Queue Entry (SQE). The descriptor, for example, may specify information such as the start location of the data to be written, the amount of data to be written, and/or other information such as a command identifier (ID), opcode(s), and the like. Storage controller 114 passes the descriptor, in the case of a redundant write operation such as a RAID 1 write operation to each of storage devices 120-1 and 120-2. Each of storage devices 120-1 and 120-2 receives the same descriptor from storage controller 114.

In response to receiving the descriptor, each of storage device 120-1 and storage device 120-2 independently fetches the data, also referred to as a message herein, using direct memory access (DMA) reads. Each of storage device 120-1 and storage device 120-2 fetches and stores, or attempts to fetch and store, the same data to effectuate the redundant write operation. Accordingly, each storage device 120-1 will store a copy of the same data. Storage controller 114 is capable of calculating error detection codes for the data transfer to each of storage devices 120-1 and 120-2. Within this disclosure, the error detection code generated for a data transfer is based solely (e.g., only) on the data that is being transferred. In the case of a redundant write operation, the error detection code for each data transfer of the redundant write operation is generated based solely on the data written to a storage device in performing the data transfer. For example, storage controller 114 is capable of calculating an error detection code based only on the particular data to be written to storage device 120-1 for the first data transfer and calculating an error detection code based only on the particular data to be written to storage device 120-2 for the second data transfer. As such, storage controller 114 is capable of detecting whether same data is written to each storage device 120 by detecting that the error detection codes for the data transfers of the redundant write operation match.

It should be appreciated that the generation and/or comparison of error detection codes as described above is to be distinguished from the generation and/or comparison of packet-based error detection codes. Storage controller 114 also is capable of comparing packet-based error detection codes. For example, each data transfer may include a packet-based error detection code embedded therein. Storage controller 114 may also generate a packet-based error detection code for the data transfer. The packet-based error detection code is generated not only based on data to be stored in data storage device(s) 120, but also based on other control data such as Peripheral Component Interconnect Express (PCIe) control data, NVMe control data, and/or other control data of the data transfer. Storage controller 114 may generate a packet-based error detection code for a data transfer and compare the generated packet-based error detection code with the packet-based error detection code extracted from the data transfer for purposes of data integrity. The generation and/or comparison of packet-based error codes, while performable by storage controller 114, is to be distinguished from the error code generation and/or comparison generally discussed within this disclosure in relation to incremental error code generation and/or comparison for data transfers of out of order data.

In one or more embodiments, the error detection codes may be Cyclic Redundancy Check (CRC) codes. Host device 102 treats the read from storage device 120-1 and the read from storage device 120-2 as independent reads to the same location. Use of the error detection codes ensures that both storage devices 120 do store the same data and that cases in which the data delivered to storage device 120-1 differs from the data delivered to storage device 120-2 are detected. Such may be the case where the buffer from which data is read is modified after data is read and provided to storage device 120-1 and prior to the data being read and provided to storage device 120-2. A successful redundant write operation will have identical error detection codes included in each of the two data transfers and as calculated incrementally for each of the two data transfers.

As described in greater detail hereinbelow, in using cut-through forwarding for each of the data transfers of the redundant write operation, storage controller 114 is capable of using an incremental error detection code generation technique in which segment-specific error detection codes are calculated as segments are received. The segment-specific error detection codes may be combined to obtain the error detection code for each data transfer. The inventive arrangements are invariant to receiving out of order segments and may use any seed value (e.g., a zero seed value and/or a non-zero seed value). The inventive arrangements are capable of generating the error detection codes (e.g., CRC codes) for incoming and out of order segments without having to store each segment of a data transfer. Further, the inventive arrangements incorporate a parallel processing technique in which each segment-specific error detection code may be generated in a single clock cycle to further reduce latency of storage controller 114.

Data processing system 100 is only one example implementation. Data processing system 100 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices.

As used herein, the term "cloud computing" refers to a computing model that facilitates convenient, on-demand network access to a shared pool of configurable computing resources such as networks, servers, storage, applications, ICs (e.g., programmable ICs) and/or services. These computing resources may be rapidly provisioned and released with minimal management effort or service provider interaction. Cloud computing promotes availability and may be characterized by on-demand self-service, broad network access, resource pooling, rapid elasticity, and measured service.

The example of FIG. 1 is not intended to suggest any limitation as to the scope of use or functionality of example implementations described herein. Data processing system 100 is an example of computer hardware that is capable of performing the various operations described within this disclosure. In this regard, data processing system 100 may include fewer components than shown or additional components not illustrated in FIG. 1 depending upon the particular type of device and/or system that is implemented. The particular operating system(s) and/or application(s) included may vary according to device and/or system type as may the types of I/O devices included. Further, one or more of the illustrative components may be incorporated into, or otherwise form a portion of, another component. For example, a processor may include at least some memory.

In one or more embodiments, storage controller 114 is implemented as an independently packaged IC. In one or more other embodiments, storage controller 114 may be implemented as a die or chiplet that may be included within one or more other dies as part of a System-in-Package or SiP or a multi-die System-on-Chip (SoC). For example, in some cases a processor such as a CPU may be implemented as one or more chiplets and packaged with storage controller 114 also implemented as a chiplet in the same package. In one or more embodiments, data processing system 100 may be implemented as an SoC and/or a SiP.

Figure 2:
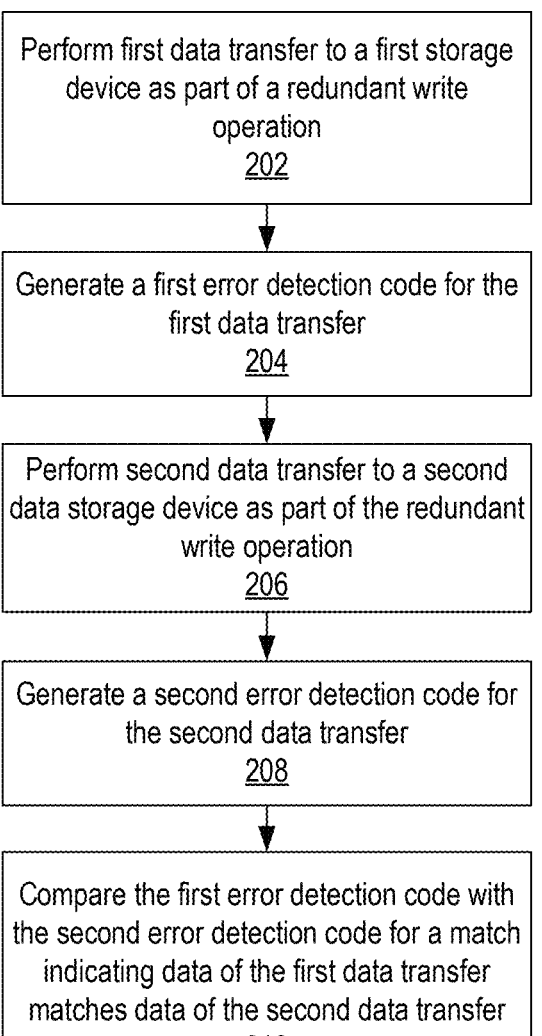
FIG. 2 illustrates a method of implementing a redundant write operation in accordance with one or more embodiments of the disclosed technology.

FIG. 2 illustrates a method 200 of implementing a redundant write operation in accordance with one or more embodiments of the disclosed technology. Method 200 may be implemented using storage controller 114 of FIG. 1. In block 202, storage controller 114 performs a first data transfer to storage device 120-1 as part of a redundant write operation. In block 204, storage controller 114 generates a first error detection code for the first data transfer. In block 206, storage controller 114 performs a second data transfer to storage device 120-2 as part of the redundant write operation. In block 208, storage controller 114 generates a second error detection code for the second data transfer. In block 210, storage controller 114 compares the first error detection code with the second error detection code for a match, where the match indicates that data of the first data transfer matches data of the second data transfer.

It should be appreciated that method 200 of FIG. 2 is illustrated with the second data transfer being performed after the first data transfer, (e.g., in serial form) for purposes of illustration. In other embodiments and/or in practice, the first and second data transfers may be performed in parallel (e.g., concurrently) or in an overlapping manner. In response to a completion being received for each of the first and second data transfers, the error detection code for each data transfer may be compared.

The foregoing and other implementations can each optionally include one or more of the following features, alone or in combination. Some example implementations include all the following features in combination.

In one or more embodiments, the first data transfer is a cut-through data transfer and the second data transfer is a cut-through data transfer.

In one or more embodiments, each of the first error detection code and the second error detection code is generated incrementally as a Cyclic Redundancy Check code.

The method may include generating a status signal indicating whether the redundant write operation is successful based on a result of the comparing.

In one or more embodiments, at least one of the first data transfer or the second data transfer includes a plurality of segments received out of order.

In one or more embodiments, the first error detection code is generated by generating a plurality of first sub-segment error detection codes in parallel and combining the plurality of first sub-segment error detection codes. The second error detection code is generated by generating a plurality of second sub-segment error detection codes in parallel and combining the plurality of second sub-segment error detection codes.

In one or more embodiments, the first error detection code is generated by applying a seed to the plurality of first sub-segment error detection codes subsequent to the combining. The second error detection code is generated by applying the seed to the plurality of second sub-segment error detection codes subsequent to the combining.

In one or more embodiments, each first sub-segment error detection code and each second sub-segment error detection code is generated in parallel in a single clock cycle.

In one or more embodiments, the first data transfer and the second data transfer each include one or more segments. The method can include, for each of the first data transfer and the second data transfer: subdividing each segment of the one or more segments into a plurality of chunks (e.g., where a chunk is a portion of a segment); generating, in parallel, a plurality of sub-segment error detection codes corresponding to the plurality of chunks; and combining the plurality of sub-segment error detection codes for each segment.

In one or more embodiments, each sub-segment error detection code of the plurality of sub-segment error detection codes corresponds to a chunk of the plurality of chunks on a one-to-one basis.

In one or more embodiments, in response to detecting a mismatch between the first error detection code and the second error detection code from the comparing indicating a failure of the redundant write operation, initiating the redundant write operation using a store-and-forward technique. It should be appreciated that in one or more other embodiments, other data mismatch protocols, e.g., remediation techniques, may be implemented in lieu of initiating the redundant write operation using the store- and forward technique. In general, firmware may be configured to take any of a variety of actions in response to detecting a mismatch as described (e.g., based on receipt and evaluation of the status signal) and that the inventive arrangements are not intended to be limited by the particular data mismatch protocols performed in response to a mismatch.

Figure 3:
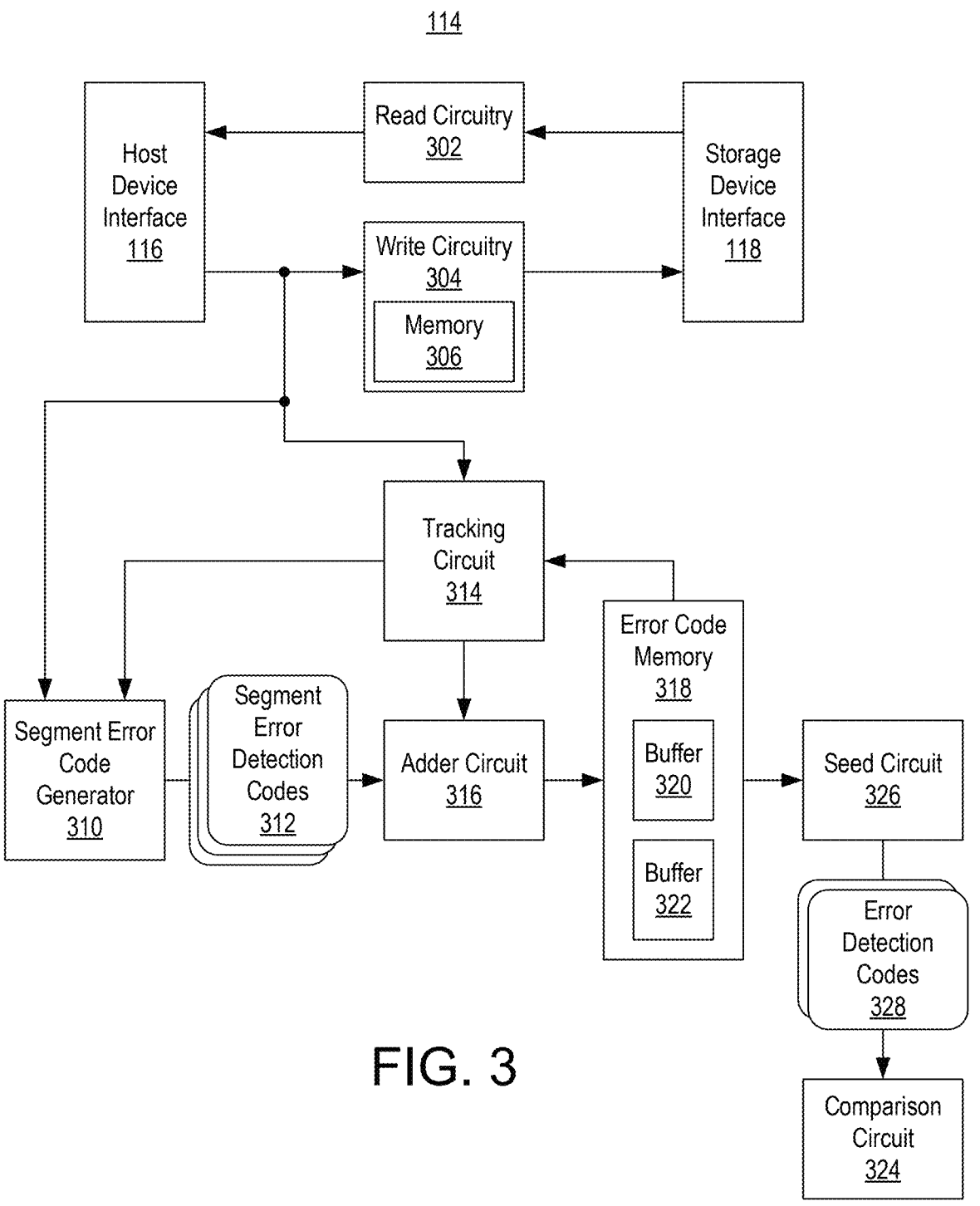
FIG. 3 illustrates an architecture for a storage controller of a data processing system in accordance with one or more embodiments of the disclosed technology.

FIG. 3 illustrates an architecture for storage controller 114 of FIG. 1 in accordance with one or more embodiments of the disclosed technology. In the example, in addition to host device interface 116 and storage device interface 118, storage controller 114 includes read circuitry 302, write circuitry 304, a segment error code generator 310, a tracking circuit 314, an adder circuit 316, an error code memory 318, a comparison circuit 324, and a seed circuit 326.

In the example, read circuitry 302 is configured to convey data fetched from storage devices 120 through storage device interface 118 to host device interface 116. Write circuitry 304 is configured to convey data received via host device interface 116 for writing to storage devices 120 though storage device interface 118. Write circuitry 304 may include a memory 306. In one or more embodiments, memory 306 is used to perform, or retry, a failed redundant write operation. In the example, memory 306 is depicted as being included in write circuitry 304. In one or more other embodiments, memory 306 may be external to write circuitry 304 and coupled thereto.

FIG. 4 illustrates another method 400 of implementing a redundant write operation in accordance with one or more embodiments of the disclosed technology. Referring to FIGS. 1, 2, 3, and 4 in combination, in block 402, host device 102 initiates a redundant write operation. For example, host device 102 sends a descriptor specifying parameters of the redundant write operation to storage controller 114.

In block 404, data storage controller 114 forwards the descriptor received from host device 102 to each storage device 120 involved in the redundant write operation. For example, write circuitry 304, being in receipt of the descriptor via host device interface 116, forwards the descriptor through storage device interface 118 to storage device 120-1 and to storage device 120-2.

In block 406, each storage device independently fetches the data (e.g., also referred to as the message) specified by the descriptor. For example, storage device 120-1 fetches the data specified by the descriptor from RAM 108. Similarly, storage device 120-2 fetches the data specified by the descriptor from RAM 108. As discussed, as each storage device 120 is using the same descriptor, each is fetching the same data though independently of the other.

The data fetched by each storage device 120 may be returned as one or more (e.g., a plurality) of different segments. The segments may be provided to, and received by, each storage device 120 out of order. That is, the order in which the segments are received by storage controller 114 and forwarded to the designated storage device 120 may be different from the order in which the segments are stored in RAM 108. Further, the order of segments received for each of the data transfers of the redundant write operation may be different. In other words, the sequence of segments received by storage controller 114 (e.g., and provided to storage device 120-1) for the first data transfer may be different than the sequence of segments received by storage controller 114 (e.g., and provided to storage device 120-2) for the second data transfer.

In block 408, the segments of data received by storage controller 114 are forwarded to the respective storage devices 120 using cut-through data forwarding (e.g., as cut-through data transfers). For example, segments received for the fetch initiated by storage device 120-1 are forwarded by write circuitry 304 to storage device 120-1. Write circuitry 304 may forward each segment to storage device 120-1 as each segment is received as opposed to assembling the plurality of segments and forwarding the entirety of the data of the data transfer. Similarly, segments received for the fetch initiated by storage device 120-2 are forwarded by write circuitry 304 to storage device 120-2. Write circuitry 304 may forward each segment to storage device 120-2 as each segment is received as opposed to assembling the plurality of segments and forwarding the entirety of the data of the data transfers. It should be appreciated that segments for the two data transfers of the redundant write operation may be received in a commingled manner (e.g., in parallel or concurrently, or overlapping). Write circuitry 304 and storage device interface 118 forward the segments to the intended storage device 120 based on header information accompanying each respective segment.

In block 410, segments of the data transfers are passed to segment error code generator 310. For example, each segment, as received by storage controller 114, is passed to segment error code generator 310. In block 412, segment error code generator 310 generates segment error detection codes 312. For example, segment error code generator 310 generates a segment error detection code 312 for each segment (e.g., the data to be written to a storage device 120) that is received. Segment error detection codes 312 are generated for segments on a one-to-one basis. Each segment error detection code 312 is a segment-specific error detection code. In one or more embodiments, each segment error detection code is generated using a zero seed value.

In block 414, segment error detection codes 312, as output from segment error generator 310, are combined with incremental error detection codes. Block 414 is illustrative of the incremental generation of error detection codes for each data transfer of the redundant write operation for out of order data.

In the example, error code memory 318 includes a buffer 320 that is used to store an incremental error detection code for the first data transfer of the redundant write operation. Buffer 322 is used to store an incremental error detection code for the second data transfer of the redundant write operation. Tracking circuit 314 is capable of performing several operations. In one aspect, tracking circuit 314 receives each segment, or the header for the segment, and evaluates header information for the segment to determine the data transfer to which the segment belongs. Tracking circuit 314 is also capable of obtaining the sequence number of the segment from the header information. The sequence number indicates the order of the segment in the data transfer. Based on the particular data transfer to which the segment belongs, tracking circuit 314 fetches the incremental error detection code for the data transfer from the appropriate buffer 320, 322.

For example, for the first segment received for the first data transfer, buffer 320 may store a "0" value for the incremental error detection code since no other segment for the first data transfer has been processed. Tracking circuit 314 fetches the incremental error detection code for the first data transfer and provides the incremental error detection code to adder circuit 316. In this case, adder circuit 316 performs an XOR function between the incremental error detection code and the segment error detection code 312 output from segment error code generator 310 for the current segment of the first data transfer. Adder circuit 316 stores the result of the XOR operation in buffer 320 as the new or updated incremental error detection code for the first data transfer. Adder circuit 316 may overwrite the prior incremental error detection code for the first data transfer in buffer 320.

For each further segment received for the first data transfer, tracking circuit 314 fetches the incremental error detection code for the first data transfer from buffer 320 and provides the incremental error detection code to adder circuit 316. Adder circuit 316 generates a result by XORing the segment error detection code for the further segment as output from segment error code generator 310 with the incremental error detection code fetched from buffer 320 and writes the result, e.g., a new or updated incremental error detection code, to buffer 320. Again, the updated incremental error detection code may overwrite the prior incremental error detection code for the data transfer in buffer 320.

Similarly, for the first segment received for the second data transfer, buffer 322 may store a "0" value for the incremental error detection code since no other segment for the second data transfer has been processed. Tracking circuit 314 fetches the incremental error detection code for the second data transfer and provides the incremental error detection code to adder circuit 316. In this case, adder circuit 316 performs an XOR function between the incremental error detection code and the segment error detection code 312 output from segment error code generator 310 for the current segment of the second data transfer. Adder circuit 316 stores the result of the XOR operation in buffer 322 as the new or updated incremental error detection code for the second data transfer. Adder circuit 316 may overwrite the prior incremental error detection code for the second data transfer in buffer 322.

For each further segment received for the second data transfer, tracking circuit 314 fetches the incremental error detection code for the second data transfer from buffer 322 and provides the incremental error detection code to adder circuit 316. Adder circuit 316 generates a result by XORing the segment error detection code for the further segment as output from segment error code generator 310 with the incremental error detection code fetched from buffer 322 and writes the result, e.g., a new or updated incremental error detection code, to buffer 322. Again, the updated incremental error detection code may overwrite the prior incremental error detection code for the data transfer in buffer 322.

In one or more embodiments, each of buffers 320 and 322 may include sufficient memory to store a plurality of different incremental error detection codes corresponding to a plurality of data transfers for a plurality of in-flight redundant write operations. Though FIG. 3 is described with respect to an example redundant write operation, the inventive arrangements are capable of supporting multiple in-flight redundant write operations.

In block 416, seed circuit 326 is capable of generating the seed to be applied to the incremental error detection code stored in error code memory 318 for each data transfer. In one or more embodiments, in response to a completion being received for each of the first data transfer and the second data transfer (e.g., from storage devices 120), seed circuit 326 is capable of generating the seed. Seed circuit 326 is further capable of fetching the incremental error detection code for the first data transfer from buffer 320 and applying the seed to the fetched incremental error detection code to generate the error detection code 328 for the first data transfer. Seed circuit 326 is further capable of fetching the incremental error detection code for the second data transfer from buffer 322 and applying the seed to the fetched incremental error detection code to generate the error detection code 328 for the second data transfer.

In one or more embodiments, block 416 is performed in response to each of the first data transfer and the second data transfer completing.

In block 418, comparison circuit 324 is capable of comparing the error detection code for each data transfer of the redundant write operation. For example, in response to determining that each data transfer of the redundant write operation has completed, comparison circuit 324 compares the error detection code for the first data transfer from seed circuit 326 with the error detection code for the second data transfer from seed circuit 326.

In block 420, comparison circuit 324 determines whether the two error detection codes match. In response to detecting that the two error detection codes do not match, method 400 continues to block 422. In response to detecting that the two error detection codes do match, method 400 continues to block 426.

Continuing with block 422 in the case where the two error detection codes do not match (e.g., a mismatch is detected), comparison circuit 324 generates a status signal indicating that a mismatch has been detected for the redundant write operation. The mismatch detected means that, for the redundant write operation, storage device 120-1 and storage device 120-2 are not storing the same data, but rather different data was transferred to each storage device. The data for the redundant write operation was not successfully mirrored to storage devices 120. As noted, the error detection codes generated in accordance with the example of FIG. 4 are generated solely based on the data of the data transfers to be written to the storage devices 120 (e.g., the segments of each data transfer of the redundant write operation). Whether by virtue of corruption of the data in transit or the data being modified prior to completion of the one or both of the first and/or second data transfers of the redundant write operation, storage devices 120 do not store the same data. Accordingly, in block 424, in response to the status signal indicating a mismatch, a data mismatch protocol may be implemented. The particular data mismatch protocol to be implemented may vary from one system to another. An example of a data mismatch protocol is described in greater detail hereinbelow.

In one or more embodiments, in response to a failed redundant write operation, storage controller 114 may initiate the redundant write operation anew albeit using a store-and-forward technique instead of the cut-through forwarding. In the example, memory 306 may be used to store segments received. The segments may be reassembled in memory 306. The error detection code for the assembled segments of the data transfer may be compared to the error detection code included in the assembled data. Write circuitry 304 may store the data, as reassembled in memory 306, to each of storage devices 120. In this example, because only failed redundant write operations are reimplemented using store-and-forward, the size of memory 306 may be significantly less than conventional store-and-forward data storage systems since store-and-forward is not performed for each redundant write operation, but just for failed operations.

Further, it should be appreciated that the signal generated by comparison circuit 324 may be provided to each data storage device 120 to indicate whether the data that was written for the data transfers should be kept or discarded. The mismatch protocol example described above is provided for purposes of illustration. In other examples, the redundant write operation may be attempted anew with continued use of cut-through forwarding. In still other examples, other error recovery techniques and/or mechanisms may be used with respect to implementing the redundant write operation and/or the discarding of inaccurate or mismatched data.

Continuing with block 426, in the case where the data of the first data transfer matches the data of the second data transfer as indicated by matching error correction codes, comparison circuit 324 generates a status signal that indicates a match. The status signal indicates a successful redundant write operation in which the storage devices store identical data. That is, the data of the redundant write operation is successfully mirrored by storage devices 120.

In one or more embodiments, in block 416, comparison circuit 324 is capable of also comparing the packet-based error detection codes as previously described. Accordingly, in one or more embodiments, a successful redundant write operation will also ensure that the packet-based error detection codes for each data transfer match.

Figure 5:
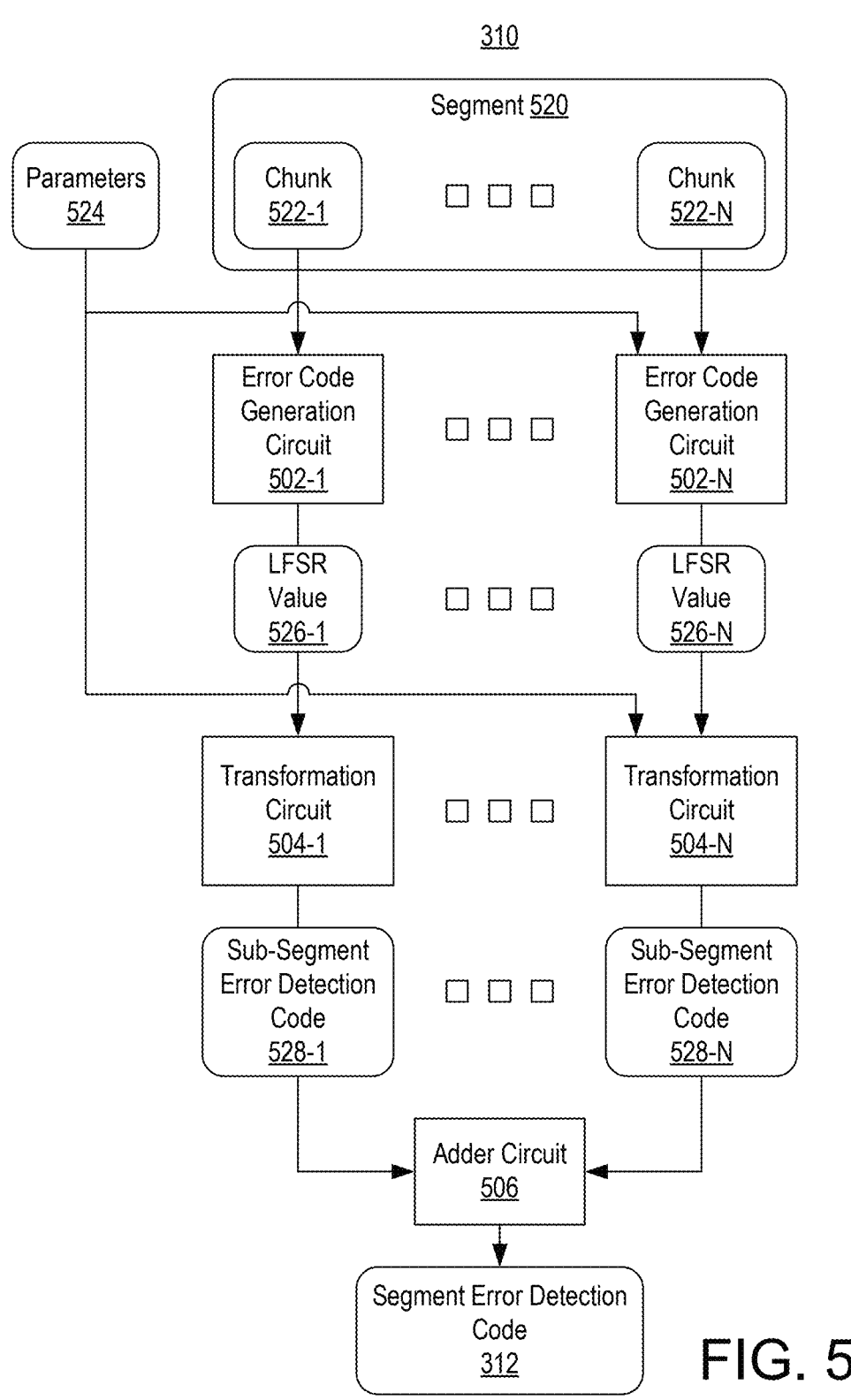
FIG. 5 illustrates an architecture for a segment error code generator of a storage controller in accordance with one or more embodiments of the disclosed technology.

FIG. 5 illustrates an architecture of segment error code generator 310 of FIG. 3 in accordance with one or more embodiments of the disclosed technology. In the example of FIG. 5, segment error code generator 310 includes a plurality of error code generation circuits 502 (e.g., illustrated as 502-1 through 502-N where N is an integer value that is equal to 2 or more), a plurality of transformation circuits 504 (e.g., illustrated as 504-1 through 504-N), and an adder circuit 506. Segment error code generator 310 may be organized as a plurality of channels feeding into adder circuit 506 where each channel includes an error code generation circuit 502 and a transformation circuit 504.

FIG. 6 illustrates a method 600 of generating segment error detection codes in accordance with one or more embodiments of the disclosed technology. Referring to FIGS. 5 and 6, in block 602, a segment 520 is received by segment error code generator 310. As noted, header information for segment 520 is received by tracking circuit 314. The header information specifies the particular data transfer of the redundant write operation to which segment 520 belongs (e.g., the first or second) and/or the order of the segment as part of the sequence of segments forming that data transfer since the segments may occur in any order.

In block 604, segment 520 is subdivided into N different chunks 522 (e.g., illustrated as chunks 522-1 through 522-N). Each chunk 522 of segment 520 is provided to a different error code generation circuit 502. In one or more embodiments, chunks 522 of segment 520 are provided to the error code generation circuits 502 on a one-to-one basis. For purposes of illustration, consider an example in which segment 520 is 512 bits and the data transfer to which segment 520 belongs has two or more segments. In one or more embodiments, segment 520 may be into N chunks where N=4 such that each chunk 522 is 128 bits in width.

It should be appreciated that the number of channels included and the number of bits processed by each channel as described is provided for purposes of illustration. The number of channels and/or the number of bits processed per channel may vary based on the size of the segments received and/or the particular application in which redundant write operations are performed.

In block 606, tracking circuit 314 detects the particular data transfer to which the segment belongs (e.g., the first data transfer directed to storage device 120-1 or the second data transfer directed to storage device 120-2). Further, tracking circuit 314 detects the particular sequence (order) of the segment within the respective data transfer. For example, segments may be received out of order and the segments for the first and second data transfers may be received in a commingled manner. The sequence of the segment indicates whether the segment is the $1^{st}$, $2^{nd}$, $3^{rd}$, etc., segment of the data transfer as the segments are originally ordered in the source device (e.g., RAM 108).

In block 608, tracking circuit 314 configures each transformation circuit 504 to operate on the respective chunk 522 of segment 520. Tracking circuit 314 configures each transformation circuit 504 by programming certain registers in each respective transformation circuit 504 with parameters 524, e.g., information, that describes which segment of the data transfer is being processed and which chunk of the segment is being processed by the respective transformation circuit 504. In one or more embodiments, the parameters 524 are offsets described hereinbelow in greater detail.

In block 610, each error code generation circuit 502 generates a Linear Feedback Shift Register (LFSR) value 526 (e.g., 526-1 through 526-N) based on the chunk 522 being processed. The LFSR value 526 is a value generated by error code generation circuit 502. In one or more embodiments, each error code generation circuit 502 is implemented as a parallel processing implementation of an LFSR circuit. For each chunk 522 received by an error code generation circuit 502, the error code generation circuit 502 is reset or cleared to begin operating anew. Each LFSR value 526 is the value that remains in the LFSR when data, e.g., a chunk, is fed into the LFSR pipeline using a zero seed.

In block 612, transformation circuits 504 transform LFSR values 526 into sub-segment error detection codes 528. For example, each transformation circuit 504 generates a sub-segment error detection code 528 (e.g., shown as 528-1 through 528-N). In block 614, the sub-segment error detection codes are combined into a segment error detection code 312. In block 614, adder circuit 506 combines each sub-segment error detection code 528-1 through 528-N, e.g., by performing an XOR function of sub-segment error detection code 528-1 through 528-N, to generate segment error detection code 312.

As discussed with reference to FIGS. 2, 3, and 4, each segment error detection code 312 is provided to adder circuit 316 and combined with the incremental error detection code for the data transfer from the corresponding buffer and written back to the buffer as the updated incremental error detection code. The incremental error detection code written to error code memory 318 for the last segment of a data transfer (e.g., the last outstanding segment of the data transfer as opposed to the last of the sequence since segments may be received in any order) is the incremental error code read from error code memory 318 in response to a completion of a data transfer to the relevant storage device 120 and to which the seed circuit 326 applies the seed.

Referring to FIGS. 1-6, in one or more embodiments, a device can include a memory (e.g., error code memory 318) configured to store incremental error detection codes for a first data transfer and a second data transfer of a redundant write operation. The device includes a segment error code generator configured to generate segment error detection codes on a per segment basis for segments of the first data transfer and the second data transfer. The device can include a tracking circuit configured to provide parameters to the segment error code generator on a per segment basis based, at least in part, on an order of the segments as received for the first data transfer and the second data transfer. The device includes an adder circuit configured to generate a first incremental error detection code by combining the segment error detection codes of the first data transfer and generate a second incremental error detection code by combining the segment error detection codes of the second data transfer. The device includes a seed circuit configured to generate a first error detection code for the first data transfer by applying a seed to the first incremental error detection code and generate a second error detection code by applying the seed to the second incremental error detection code. The device includes a comparison circuit configured to compare the first error detection code with the second error detection code.

The foregoing and other implementations can each optionally include one or more of the following features, alone or in combination. Some example implementations include all the following features in combination.

In one or more embodiments, the first data transfer is a cut-through data transfer and the second data transfer is a cut-through data transfer.

In one or more embodiments, each of the first error detection code and the second error detection code is generated incrementally as a CRC code.

In one or more embodiments, the comparison circuit is configured to generate a status signal indicating whether the redundant write operation is successful based on a result of comparing the first error detection code with the second error detection code.

In one or more embodiments, at least one of the first data transfer or the second data transfer includes a plurality of segments received out of order.

In one or more embodiments, the segment error code generator includes a plurality of channels. Each channel includes an error code generation circuit and a transformation circuit. The parameters are provided to the transformation circuit and include offset information.

In one or more embodiments, wherein the segment error code generator includes an adder circuit configured to generate the segment error detection codes by combining, for each segment, a result (e.g., a sub-segment error detection code) from each channel.

As discussed, in one or more embodiments, the error detection code is implemented as a CRC code. In general, a CRC code is generated based on two polynomials m(x) and g(x), where m(x) represents a message polynomial (e.g., the data) and g(x) represents a generator polynomial. The CRC code may be defined as r(x) where r(x)={m(x), degree of polynomial {0}} mod g(x). In the example, {m(x), r(x)} is divisible by g(x) such that any non-zero value denotes bit error.

In the general case, to calculate a CRC code, a division technique is implemented using serially operated LFSR circuits that are built using flops and XOR gates. The placement of these components in forming a serially operated LFSR circuit depends on g(x). The initial value stored in the flops of such an LFSR circuit before the first bit of the message m(x) is processed is referred to as the "seed."

A serially operated LFSR circuit is capable of generating only one bit of data each clock cycle. For example, for a message polynomial of length m having $g(x)=x^3+x+1$, a serially operated LFSR circuit will require m cycles to generate a CRC code. As message lengths increase, the latency of the data storage system increases and becomes impractical particularly for a data storage system that utilizes cut-through data forwarding. Further, with cut-through data forwarding, generation of the CRC code for data received as out of order segments is performed without storing the respective segments or all of the respective segments.

In accordance with the inventive arrangements described herein, higher throughput is achieved by performing error detection code generation using a parallel processing technique. As illustrated in the examples of FIGS. 3, 4, 5, and 6, segment error code generator 310 is capable of operating in parallel such that each segment error detection code 312 may be generated in a single clock cycle.

With respect to out of order, incremental CRC generation, the CRC is a linear function. As such, CRC generation obeys the laws of linearity. The CRC code of m(x) will equal the sum of the CRC code of each segment of m(x). In this example, each segment $S_i(x)$ contributes a sub-segment CRC code (e.g., the sub-segment error detection code) $x^{l_i}S_i(x)$. If the message is broken into N segments of respective lengths $|S_i|$, Expression 1 below may be obtained.

$$m(x) = \sum_{i=1}^{s} x^{l_i} S_i(x) \text{ with } l_i = \sum_{j=1}^{i-1} |S_j| \qquad (1)$$

In Expression 1, the term $l_i$ is the offset of segment $S_i$ within the message m, measured by the number of bits from the least significant bit of m to the least significant bit of $S_i$. Direct calculation of Expression 1 thus calls for feeding the arriving segment $S_i$, followed by a tail of $l_i$ zeros, into an LFSR wired according to the generator polynomial g(x) providing Expression 2 below.

$$C(m(x)) = (x^r m(x)) \bmod g(x) = \sum_{i=1}^{s} \left\{ \left( x^r x^{l_i} S_i(x) \right) \bmod g(x) \right\} \qquad (2)$$

Based on g(x), a transformation matrix T can be generated such that the contents of the LFSR registers of the LFSR circuit, at least in the serially operated LFSR circuit case, are a function of T if the input message m(x) as fed is all zeros. Transformation matrices may be generated using known techniques. For example, a transformation matrix may be formed using the generator polynomial. Each column of the transformation matrix is generated when the LFSR circuit has a single 1 value stored in one of the registers while the rest of the registers store a 0 value. For the first column of the transformation matrix, the LFSR seed will be 0b100, followed by 0b010, and then 0b001. With these seeds, a single bit 0 value is fed into the LFSR circuit and the output of the LFSR circuit forms the columns of the transformation matrix. In illustration, for the seed 0b100, the output obtained in response to providing a single bit 0 is 0b010 corresponding to column 1 of the transformation matrix. For the seed 0b010, the output obtained in response to providing a single bit 0 value is 0b001 corresponding to the second column of the transformation matrix. For the seed 0b001, the output obtained in response to providing a single bit 0 value is 0b110 corresponding to the third column of the transformation matrix. In a programming context, the transformation matrix can be defined as follows: given an LFSR of r bit registers, let T be the r×r binary transformation matrix in which $T_{ij}=1$, iff bit register j directly feeds bit register i in the LFSR, i.e., there is a wire leading from bit register j to bit register i, possibly going through adders, but not through other bit registers. For example, for $g(x)=x^3+x+1$, the transformation matrix is:

$$T = \begin{bmatrix} 0 & 0 & 1 \\ 1 & 0 & 1 \\ 0 & 1 & 0 \end{bmatrix}$$

Given the transformation matrix shown above, the column vector p denotes the current contents of the LFSR bit registers with the leftmost bit register at the top of the vector. In the case where the input to the serially operated LFSR circuit consists of zeros only, then after one clock cycle the contents of the bit registers will be matrix multiplication of T and p, where matrix operations are carried out in GF(2) (i.e., modulo 2). In other words, if p denotes the current contents of a serially operated LFSR circuit and the input consists of only zeros, then after two clock cycles the contents of the LFSR circuit will be T*T*p. After i clock cycles, the contents will be $T^i*p$.

Consider a message S of size m that is divided into (e.g., received as) two segments S1 and S2 such that S={S2, S1}. If the length of S1 is k, the length of S2 is m−k. In this example, the offset for S1 will be 0 and the offset of S2 will be k. To get the CRC code of message S for generator polynomial G(x), the partial CRC code of S1 and of S2 may be generated and then summed.

In the following example, the offset for S1 is L1=0. The offset for S2 is L2=k. Accordingly, the CRC code for segment S1 may be generated as Expression 3 and the CRC for segment S2 may be generated as Expression 4.

$$CRC(S1) = LFSR(S1) \qquad (3)$$

$$CRC(S2) = LFSR(\{S2, k \text{ number of } 0's\}) \qquad (4)$$

Expression 4 may be simplified to $T^{offset}*LFSR(S2)$ and then to $T^k*LFSR(S2)$. The CRC code for the message S may be expressed as Expression 5 below.

$$CRC(S) = CRC(s2) XOR CRC(S1) \qquad (5)$$

Further discussion of out of order, incremental CRC computation, which presumes a seed value of 0, may be found in Satran, et al., "Out of Order Incremental CRC Computation," IBM Haifa Labs, Feb. 25, 2003 (hereafter "Satran"), which is incorporated herein in its entirety by reference. Satran presumes a seed value of 0 and further presumes serial operation of an LFSR circuit which, as described, has an untenable amount of latency for use with cut-through forwarding.

To achieve higher throughput, parallel implementation of segment error code generator 310 is needed. For example, serially operated LFSR circuits may be converted into a plurality of parallel operated circuits that, when taken collectively, have a bit width of the width of a segment. For purposes of discussion, a segment may be b bits in width such that segment error code generator 310 is capable of processing b bits each clock cycle. In one or more embodiments, segment error code generator 310 may be implemented using a known parallel processing technique as discussed in Stavinov, "A Practical Parallel CRC Generation Method," Circuit Cellar, issue 234, January 2010 (hereafter "Stavinov"), which is fully incorporated herein by reference. Stavinov discusses a technique for generating a parallel CRC circuit capable of operating on any polynomial and data size.

In implementing parallel processing for segment error code generator 310, the linearity principle of CRC operation is used where any CRC value changes only if there is a 1 in either the current CRC state or in the input data. If both the current CRC state and the input data are tied to 0, the CRC output will always be 0. Accordingly, consider the case in which only the input data changes from 0 to 1 keeping the current CRC state constant to 0 and similarly the case in which the current CRC state is changed to 1 keeping the inputs tied to 0. In each case, only those positions that output a value of 1 are considered for the final CRC equation as implemented by the resulting circuitry. Based on the generator polynomial, a serial CRC generator may be implemented that provides the CRC output based on the current CRC state and input data bit.

This may be extrapolated to N-bits of data by calling the segment error code generator 310 N times to provide the CRC output of the N-bit data. In order to implement a parallel circuit implementation capable of processing N-bit input data and having an M-bit current CRC state (i.e., an M-bit generator polynomial that generates a CRC output defined as $M_{out}$), two matrices H1 and H2 may be defined. For purposes of discussion, $M_{out}$ represents the next CRC state, $N_{In}$ represents the input data, and $M_{In}$ represents the current CRC state. The H1 matrix describes $M_{out}$ as a function of $N_{In}$ when $M_{In}=0$. This makes the size of the H1 matrix [N×M]. Similarly, the H2 matrix describes $M_{out}$ as a function of $M_{In}$ when $N_{In}=0$. This makes the size of the H2 matrix as [M×M].

Accordingly, for N=4 and M=5, the H1 matrix may be built by keeping the $M_{in}$ value 0 while driving input values of 4'b0001, 4'b0010, 4'b0100 and 4'b1000. The output values of these 4 operations are filled into the H1 matrix. Similarly, for the H2 matrix, the input is always tied to 4'b0000 while $M_{in}$ is changed from 4'b00001, 4'b00010, 4'b00100, 4'b01000, 4'b10000. The outputs are filled in the H2 matrix. Based on the H1 and H2 matrices, the bit positions of N and M for which the $M_{out}$ is 1 may be determined so as to obtain the CRC output of N-bit inputs based on the current CRC value and the current input value using XOR gates.

For purposes of discussion, a segment Si may be formed of a plurality of portions or partial segments called "chunks." The out of order processing previously discussed for segments may be applied to process partial segments or chunks as illustrated in Expression 6.

$$CRC(Si) = CRC(C1) XOR\ CRC(C2) XOR\ CRC(C3) \qquad (6)$$

In Expression 6, the segment S1 includes 3 chunks C1, C2, and C3. Expression 6 may be rewritten as Expression 7 below.

$$CRC(Si) = \qquad (7)$$

$$\left(T^{L0} * LFSR(C1)\right) XOR\left(T^{L1} * LFSR(C2)\right) XOR\left(T^{L2} * LFSR(C3)\right)$$

Within Expression 7, T represents the transformation matrix for a given generator polynomial g(x), C1 is a chunk of an out of order segment Si having an offset value of L0, C2 is another chunk of the out of order segment Si having an offset value of L1, and C3 is another chunk of the out of order segment Si having an offset value of L2. Expression 7 illustrates that the CRC code for each chunk may be generated by multiplying the LFSR value generated for the chunk by the transformation matrix T, given the generator polynomial g(x), raised to the power of the offset of the chunk. Expression 7 illustrates that, based on the linearity principle of the LFSR function and using a parallel processing technique, the CRC code for out of order partial segments for a seed value of 0 can be generated. This technique may be adapted for non-zero seed values.

An initial seed value of 0 may not be preferred because the deliberate or accidental addition of one or more leading zeros (e.g., leading zero bytes) to data may not be detected. In the case where a CRC circuit is initialized with an all zero seed value, any number of all zero data word chunks may be fed into the CRC circuit and the CRC circuit will remain at a zero value. This means that information about how many zero chunks were processed is discarded. If the CRC circuit is initialized to any non-zero value, processing chunks with a value of zero will cycle patterns through the CRC circuit such that the number of zero-valued chunks that have been processed is tracked as a sort of counter.

In performing the parallel CRC calculation such that segment error detection codes may be generated in a single clock cycle, non-zero seed values must be accommodated. The linearity principle of LFSR/CRC is only applicable if the CRC of a string of zeroes is always zero. In cases with any non-zero seed value, the CRC of string values are not always zero and are a function of the number of zeros fed as input to the LFSR circuit, the linearity principle does not hold.

In general, an LFSR circuit operates in accordance with the principle that initially the LFSR registers have the seed value and then m(x) is provided sequentially bit-by-bit with the most significant bits at the start. If it is assumed that the LFSR registers are initially filled with all zeros, there will be a sequence of bits S(x) such that the LFSR registers change from all zeros to the seed value as intended.

For purposes of illustration, consider an example of a 4-bit CRC having a seed of all 1's (4'b1111) for a message M(x). In this example, a sequence of bits S(x) may be determined that changes the LFSR registers from all zeros to all ones. In this case, S(x) and M(x) may be considered as two segments of a larger message. Partial CRC may be applied to each to calculate the CRC of M(x) with the seed 4'b1111. The message M(x) may be divided into three segments M1(x), M2(x) and M3(x) with generator polynomial G(x) and seed s(x) such that a sequence of bits p(x) is needed to convert seed 0 to seed s(x).

Rewriting Expression 6 using the above notation and incorporating p(x) results in Expression 8 below, where bits p(x) is an unknown sequence of bits.

$$CRC(M(x)) = \qquad (8)$$

$$CRC(p(x))XOR\ CRC(M1(x))XOR\ CRC(M2(x))XOR\ CRC(M3(x))$$

CRC(p(x)) may be rewritten as Expression 9 below.

$$CRC(p(x)) = T^{Length(M(x))} * LFSR(p(x)) \qquad (9)$$

In Expression 9, Length(M(x)) is the length of M(x) in bits. Since p(x) is set before the complete M(x) to transition the seed from all zeros to s(x), the offset of p(x) is the length of M(x). Expression 9 may be rewritten as Expression 10 below.

$$CRC(p(x)) = T^{Length(M(x))} * s(x) \qquad (10)$$

In Expression 10, s(x)=LFSR (p(x)) because when p(x) is fed to an LFSR circuit with a seed value of 0, the final LFSR register content after p(x) is processed is s(x) which is the definition of an LFSR. As such, CRC(M(x)) may be expressed as Expression 11.

$$CRC(M(x) = \left(T^{Length(M(x))} * s(x)\right) \qquad (11)$$

$$XOR\ CRC(M1(x))XOR\ CRC(M2(x))XOR\ CRC(M3(x))$$

For purposes of illustration, consider an example in which M(x)=0b111101110 and G(x)=0b1011 with the seed being 0b111. The expected CRC in this example is 0b011 or 0b110 depending on whether the LFSR registers are viewed from left to right or from right to left. In this example, M(x) is divided into 3 segments as follows (moving from right to left): M1(x)=0b1111, M2(x)=0b011, and M3(x)=0b10. Expression 11 may be rewritten as Expression 12.

$$CRC(M(x)) = \qquad (12)$$

$$\left(T^9 * seed\right)xor\ CRC(M1(x))xor\ CRC(M2(x))xor\ CRC(M3(x))$$

The exponent "9" for the transformation matrix comes from the length of M(x) in bits. The CRC codes for M1(x), M2(x), and M3(x) are illustrated below as Expressions 13, 14, and 15.

$$CRC(M1(x)) = T^5 * (0b1111) = 0b110 \qquad (13)$$

$$CRC(M2(x)) = T^2 * LFSR(0b011) = 0b010 \qquad (14)$$

$$CRC(M(3)x) = LFSR(0b10) = 0b011 \qquad (15)$$

The final CRC=(0b100) XOR (0b110) XOR (0b010) XOR (0b011)=06011, which matches the expected CRC previously noted.

Figure 7:
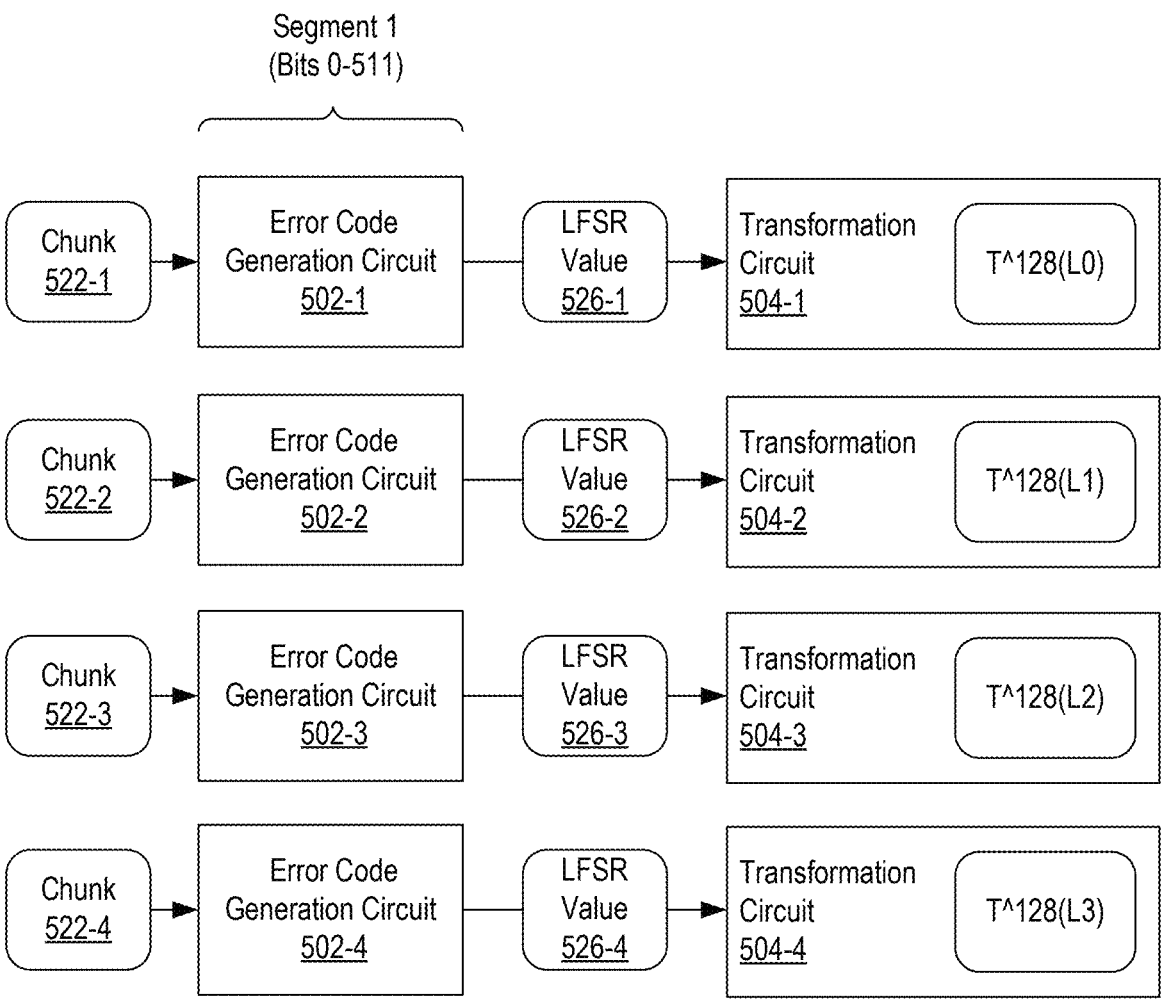
FIGS. 7 and 8 illustrate an example of configuring transformation circuits of a storage controller in accordance with one or more embodiments of the disclosed technology.
Figure 8:
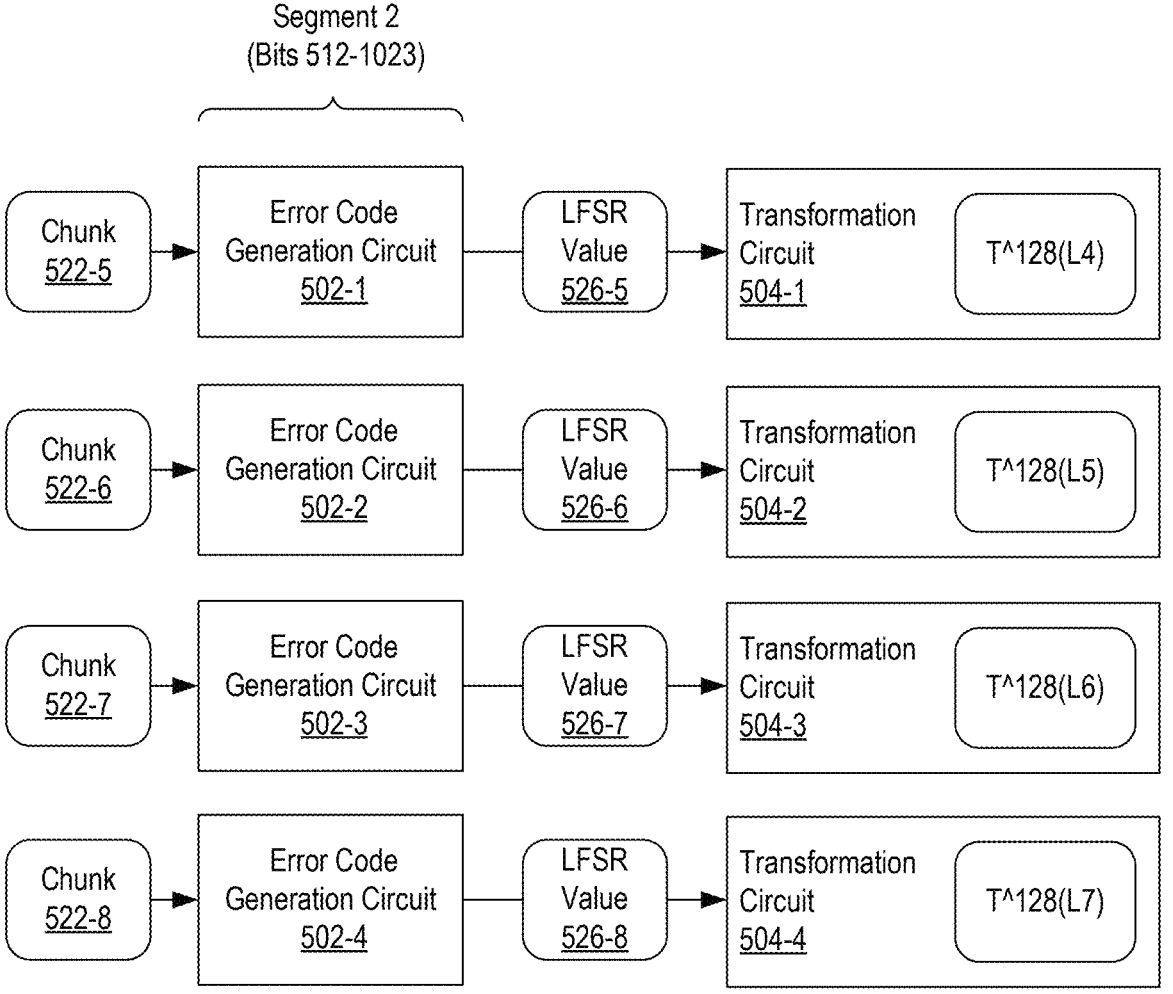

FIGS. 7 and 8 illustrate an example of configuring transformation circuits 504 in accordance with one or more embodiments of the disclosed technology. For purposes of illustration, consider an example in which a redundant write operation is transferring 1 KB of data (1024 bits). In this example, each of the first data transfer of the redundant write operation and the second data transfer of the redundant write operation is transferring the same 1024 bits of data and is performed using cut-through forwarding. With cut-through forwarding, the message, e.g., the data being transferred, is broken up by the sender into smaller segments, which travel independently to the receiver. The segments arrive at the receiver in any order. In this example, for purposes of illustration, the data is split into two segments each having a data portion or payload of 512 bits. In the example of FIGS. 7 and 8, there are 4 different error code generation circuits 502-1, 502-2, 502-3, and 502-4 that couple to respective transformation circuits 504-1, 504-2, 504-3, and 504-4.

Referring to FIG. 7, the first segment (e.g., segment 1) is received by storage controller 114. Segment 1 includes bits 0-511 of the data transfer. For ease of illustration, bits are numbered 0 through 1023. Error code generation circuit 502-1 receives chunk 522-1 including bits 0-127 of segment 1. Error code generation circuit 502-2 receives chunk 522-2 including bits 128-255 of segment 1. Error code generation circuit 502-3 receives chunk 522-3 including bits 256-383 of segment 1. Error code generation circuit 502-4 receives chunk 522-4 including bits 384-511 of segment 1.

Each error code generation circuit 502 generates an LFSR value 526 for the chunk received (e.g., a result of a parallel LFSR operation using a zero value seed) and provides the LFSR value 526 to the corresponding transformation circuit 504. Tracking circuit 314 detects, from the header of segment 1, that the segment is the first segment in the sequence of segments of the data transfer being performed (as opposed to the order of receipt of segments). Accordingly, tracking circuit 314 programs transformation circuits 504 by providing an offset to each transformation circuit 504.

As illustrated, tracking circuit 314 writes offset information to each transformation circuit 504. Each transformation circuit 504 is configured to apply the transformation matrix to the received LFSR value 526 as raised to the power shown, which is a function of the number of bits processed by the corresponding error code generation circuit (e.g., 128 in this example) and the offset of the chunk not only in the segment, but in the context of the entire data payload for the transfer. With a 1024-bit data transfer, the offset of the data being processed corresponds to the chunk and the order or sequence of that chunk in the entire 1024-bit data transfer.

For example, transformation circuit 504-1 applies the transformation matrix T raised to the first power ($T^{128}*L0$, where L0=0) to LFSR value 526-1. Transformation circuit 504-2 applies the transformation matrix T raised to the $128^{th}$ power ($T^{128}*L1$, where L1=1) to LFSR value 526-2. Transformation circuit 504-3 applies the transformation matrix T raised to the $256^{th}$ power ($T^{128}*L2$, where L2=2) to LFSR value 526-3. Transformation circuit 504-4 applies the transformation matrix T raised to the $384^{th}$ power ($T^{128}*L3$, where L3=3) to LFSR value 526-4.

In the example, each of transformation circuits 504-1, 504-2, 504-3, and 504-4 uses a zero seed value. The resulting sub-segment error detection codes 528 may be combined by adder circuit 506 by performing an XOR of each sub-segment error detection code received from transformation circuits 504 for segment 1. In this example, tracking circuit 314 writes the L0, L1, L2, and L3 values to transformation circuits 504-1, 504-2, 504-3, and 504-4, respectively.

Referring to FIG. 8, the second segment (e.g., segment 2) is received by storage controller 114. Segment 2 includes bits 512-1023 of the data transfer. Error code generation circuit 502-1 receives chunk 522-5 including bits 512-639 of segment 2. Error code generation circuit 502-2 receives chunk 522-6 including bits 640-767 of segment 2. Error code generation circuit 502-3 receives chunk 522-7 including bits 768-895 of segment 2. Error code generation circuit 502-4 receives chunk 522-8 including bits 896-1023 of segment 2.

Each error code generation circuit 502 generates an LFSR value 526 for the chunk received and provides the LFSR value 526 to the corresponding transformation circuit 504. Tracking circuit 314 detects, from the header of segment 2 that the segment is the second segment of the data transfer being performed (e.g., the second segment in the sequence as opposed to the order of receipt). Accordingly, tracking circuit 314 programs transformation circuits 504 by providing an offset to each transformation circuit 504.

In the example of FIG. 8, since the second segment includes chunks 5-8 (as ordered with respect to the original data being transferred), tracking circuit 314 writes the value (e.g., offset) to each transformation circuit 504 where the offsets continue from the example of FIG. 7 having values of 4, 5, 6, and 7 (e.g., L4, L5, L6, and L7). For example, transformation circuit 504-1 applies the transformation matrix T raised to the $512^{th}$ power ($T^{128}*L4$, where L4=4) to LFSR value 526-5. Transformation circuit 504-2 applies the transformation matrix T raised to the $640^{th}$ power ($T^{128}*L5$, where L5=5) to LFSR value 526-6. Transformation circuit 504-3 applies the transformation matrix T raised to the $768^{th}$ power ($T^{128}*L6$, where L6=6) to LFSR value 526-7. Transformation circuit 504-4 applies the transformation matrix T raised to the $896^{th}$ power ($T^{128}*L7$, where L7=7) to LFSR value 526-8.

In the example of FIG. 8, each transformation circuit 504 uses a zero seed. That is, the seed used by each transformation circuit 504 is a zero seed. The resulting sub-segment error detection codes 528 may be combined by adder circuit 506 by performing an XOR of each sub-segment error detection code received from transformation circuits 504 for segment 2.

In the example of FIGS. 7 and 8, it should be appreciated that the segments may be received in the reverse order where segment 2 is received prior to segment 1. In that case, the inventive arrangements operate by performing the operation illustrated in FIG. 8 first followed by the operation illustrated in FIG. 7 with tracking circuit 314 loading the appropriate or segment-specific offsets. As discussed, tracking circuit 314 is capable of detecting the particular segment being operated on and loading the appropriate offsets into the transformation circuits 504 of the segment error code generator 310.

The example of FIGS. 7 and 8 illustrates that the error detection code for each data transfer is generated in an incremental manner using a zero seed value. The seed is later applied by seed circuit 326. Further, owing to the parallel operation of segment error code generator 310 illustrated in FIGS. 7 and 8, each segment error detection code may be generated in a single clock cycle thereby significantly reducing latency.

In one or more embodiments, a method includes, for each of a plurality of data transfers of a redundant storage operation, receiving a plurality of segments of data. Each segment is subdivided into a plurality of chunks. A plurality of sub-segment error detection codes corresponding to the chunks are generated in parallel. For each segment, a segment error detection code is generated by combining a plurality of sub-segment error detection codes for the segment. An error detection code for each data transfer of the plurality of data transfers is generated by combining each segment error detection code of the data transfer and applying a seed thereto.

The foregoing and other implementations can each optionally include one or more of the following features, alone or in combination. Some example implementations include all the following features in combination.

In one or more embodiments, the method includes comparing the error detection code for a first data transfer of the plurality of data transfers of the redundant storage operation with an error detection code for a second data transfer of the plurality of data transfers of the redundant storage operation.

In one or more embodiments, each of the plurality of data transfers of the redundant storage operation is a cut-through data transfer.

The terminology used herein is for the purpose of describing particular embodiments only and is not intended to be limiting. Notwithstanding, several definitions that apply throughout this document are expressly defined as follows.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise.

As defined herein, the term "automatically" means without human intervention.

As defined herein, the term "computer-readable storage medium" means a storage medium that contains or stores program instructions for use by or in connection with an instruction execution system, apparatus, or device. As defined herein, a "computer-readable storage medium" is not a transitory, propagating signal per se. The various forms of memory, as described herein, are examples of computer-readable storage mediums. A non-exhaustive list of examples of a computer-readable storage medium includes an electronic storage device, a magnetic storage device, an optical storage device, an electromagnetic storage device, a semiconductor storage device, or any suitable combination of the foregoing. A non-exhaustive list of more specific examples of a computer-readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a double-data rate synchronous dynamic RAM memory (DDR SDRAM or "DDR"), a portable compact disc read-only memory (CD-ROM), a digital versatile disk (DVD), a memory stick, a floppy disk, or the like.

As defined herein, the phrase "in response to" and the phrase "responsive to" means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "hardware processor" means at least one hardware circuit. The hardware circuit may be configured to carry out instructions contained in program code. The hardware circuit may be an integrated circuit. Examples of a hardware processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, a controller, and a Graphics Processing Unit (GPU).

As defined herein, the terms "one embodiment," "an embodiment," "in one or more embodiments," "in particular embodiments," or similar language mean that a particular feature, structure, or characteristic described in connection with the embodiment is included in at least one embodiment described within this disclosure. Thus, appearances of the aforementioned phrases and/or similar language throughout this disclosure may, but do not necessarily, all refer to the same embodiment.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc., may be used herein to describe various elements. These elements should not be limited by these terms, as these terms are only used to distinguish one element from another unless stated otherwise or the context clearly indicates otherwise.

A computer program product may include a computer-readable storage medium (or mediums) having computer-readable instructions thereon for causing a processor to carry out aspects of the inventive arrangements described herein. Within this disclosure, the term "program code" is used interchangeably with the term "computer-readable instructions." Computer-readable instructions described herein may be downloaded to respective computing/processing devices from a computer-readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer-readable instructions from the network and forwards the computer-readable instructions for storage in a computer-readable storage medium within the respective computing/processing device.

Computer-readable instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer-readable instructions may include state-setting data. The computer-readable instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer-readable instructions by utilizing state information of the computer-readable instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer-readable instructions, e.g., program code.

These computer-readable instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the operations specified in the flowchart and/or block diagram block or blocks.

The computer-readable instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The descriptions of the various embodiments of the disclosed technology have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of redundant data storage, comprising:
performing a first data transfer to a first storage device as part of a redundant write operation, wherein the first data transfer is a cut-through data transfer;
generating a first error detection code for the first data transfer;
performing a second data transfer to a second storage device as part of the redundant write operation, wherein the second data transfer is a cut-through data transfer;
generating a second error detection code for the second data transfer; and
comparing the first error detection code with the second error detection code for a match indicating data of the first data transfer matches data of the second data transfer;
wherein the generating the first error detection code and the generating the second error detection code each include generating segment error detection codes on a per segment basis, combining the segment error detection codes into a result, and applying a seed to the result.

2. The method of claim 1, wherein each of the first error detection code and the second error detection code is generated incrementally as a Cyclic Redundancy Check code.

3. The method of claim 1, further comprising:
generating a status signal indicating whether the redundant write operation is successful based on a result of the comparing.

4. The method of claim 1, wherein at least one of the first data transfer or the second data transfer includes a plurality of segments received out of order.

5. The method of claim 1, wherein the first error detection code is generated by generating a plurality of first sub-segment error detection codes in parallel and combining the plurality of first sub-segment error detection codes; and
wherein the second error detection code is generated by generating a plurality of second sub-segment error detection codes in parallel and combining the plurality of second sub-segment error detection codes.

6. The method of claim 5, wherein each first sub-segment error detection code and each second sub-segment error detection code are generated in parallel in a single clock cycle.

7. The method of claim 5, wherein the first error detection code is generated by applying the seed to the plurality of first sub-segment error detection codes subsequent to the combining; and
wherein the second error detection code is generated by applying the seed to the plurality of second sub-segment error detection codes subsequent to the combining.

8. The method of claim 1, wherein the first data transfer and the second data transfer each include one or more segments, wherein the method comprises, for each of the first data transfer and the second data transfer:
subdividing each segment of the one or more segments into a plurality of chunks;
generating, in parallel, a plurality of sub-segment error detection codes corresponding to the plurality of chunks; and combining the plurality of sub-segment error detection codes for each segment.

9. The method of claim 1, further comprising:
in response to detecting a mismatch between the first error detection code and the second error detection code from the comparing indicating a failure of the redundant write operation, initiating the redundant write operation using a store-and-forward technique.

10. A device, comprising:
a memory configured to store incremental error detection codes for a first data transfer and a second data transfer of a redundant write operation;
a segment error code generator circuitry configured to generate segment error detection codes on a per segment basis for segments of the first data transfer and the second data transfer;
a tracking circuit configured to provide parameters to the segment error code generator circuitry on a per segment basis based, at least in part, on an order of the segments as received for the first data transfer and the second data transfer;
an adder circuit configured to generate a first incremental error detection code by combining the segment error detection codes of the first data transfer and generate a second incremental error detection code by combining the segment error detection codes of the second data transfer;
a seed circuit configured to generate a first error detection code for the first data transfer by applying a seed to the first incremental error detection code and generate a second error detection code by applying the seed to the second incremental error detection code; and
a comparison circuit configured to compare the first error detection code with the second error detection code.

11. The device of claim 10, wherein the first data transfer is a cut-through data transfer and the second data transfer is a cut-through data transfer.

12. The device of claim 10, wherein each of the first error detection code and the second error detection code is generated incrementally as a Cyclic Redundancy Check code.

13. The device of claim 10, wherein the comparison circuit is configured to generate a status signal indicating whether the redundant write operation is successful based on a result of comparing the first error detection code with the second error detection code.

14. The device of claim 10, wherein at least one of the first data transfer or the second data transfer includes a plurality of segments received out of order.

15. The device of claim 10, wherein the segment error code generator circuitry comprises:
a plurality of channels, wherein each channel includes an error code generation circuit and a transformation circuit; and
wherein the parameters are provided to the transformation circuit and include offset information.

16. The device of claim 15, wherein the segment error code generator circuitry comprises:
an adder circuit configured to generate the segment error detection codes by combining, for each segment, a result from each channel.

17. A method, comprising:
for each of a plurality of data transfers of a redundant storage operation:
receiving a plurality of segments of data;
subdividing each segment into a plurality of chunks;

generating, in parallel, a plurality of sub-segment error detection codes corresponding to the plurality of chunks;

for each segment, generating a segment error detection code by combining the plurality of sub-segment error detection codes for the segment; and generating an error detection code for each data transfer of the plurality of data transfers by combining each segment error detection code of the data transfer and applying a seed thereto;

wherein each of the plurality of data transfers of the redundant storage operation is a cut-through data transfer.

18. The method of claim 17, further comprising:

comparing the error detection code for a first data transfer of the plurality of data transfers of the redundant storage operation with the error detection code for a second data transfer of the plurality of data transfers of the redundant storage operation.

* * * * *